(12) United States Patent
Xuan et al.

(10) Patent No.: US 8,280,330 B2
(45) Date of Patent: Oct. 2, 2012

(54) CRYSTAL-LESS CLOCK GENERATION FOR RADIO FREQUENCY RECEIVERS

(75) Inventors: Peiqi Xuan, Saratoga, CA (US); Yifeng Zhang, San Jose, CA (US)

(73) Assignee: Quintic Holdings, Santa Clara, CA (US)

( * ) Notice: Subject to any disclaimer, the term of this patent is extended or adjusted under 35 U.S.C. 154(b) by 428 days.

(21) Appl. No.: 12/649,345

(22) Filed: Dec. 30, 2009

(65) Prior Publication Data

US 2011/0159835 A1    Jun. 30, 2011

(51) Int. Cl.
*H04B 1/06* (2006.01)
*H04B 7/00* (2006.01)
*H04B 1/18* (2006.01)

(52) U.S. Cl. ............. 455/255; 455/161.1; 455/208; 455/256; 455/258; 455/318

(58) Field of Classification Search ............ 455/76, 455/147, 161.1, 161.3, 165.1, 208, 255–265, 455/318–319, 502
See application file for complete search history.

(56) References Cited

U.S. PATENT DOCUMENTS

| | | | | |
|---|---|---|---|---|
| 5,357,544 A * | 10/1994 | Horner et al. | | 375/340 |
| 5,793,818 A * | 8/1998 | Claydon et al. | | 375/326 |
| 6,215,819 B1 * | 4/2001 | Hyakudai et al. | | 375/240 |
| 6,298,100 B1 * | 10/2001 | Bouillet | | 375/326 |
| 6,351,631 B1 * | 2/2002 | Noeske et al. | | 455/260 |
| 6,701,133 B1 * | 3/2004 | Bennett et al. | | 455/71 |
| 6,707,861 B1 * | 3/2004 | Stewart | | 375/321 |
| 6,882,373 B2 * | 4/2005 | Hong et al. | | 348/726 |
| 6,901,146 B1 * | 5/2005 | Taura et al. | | 381/3 |
| 7,027,528 B2 * | 4/2006 | Liu et al. | | 375/321 |
| 7,123,600 B2 * | 10/2006 | Ozluturk et al. | | 370/335 |
| 7,433,417 B2 * | 10/2008 | Tirry et al. | | 375/270 |
| 7,706,431 B2 * | 4/2010 | Eerola et al. | | 375/150 |
| 7,787,630 B2 * | 8/2010 | Lerner et al. | | 381/2 |
| 8,031,813 B2 * | 10/2011 | Kim et al. | | 375/326 |
| 8,130,873 B2 * | 3/2012 | Lee | | 375/321 |
| 2003/0016773 A1 * | 1/2003 | Atungsiri et al. | | 375/355 |
| 2004/0120386 A1 * | 6/2004 | Grilli et al. | | 375/148 |
| 2008/0260044 A1 * | 10/2008 | Yun et al. | | 375/240.26 |

* cited by examiner

*Primary Examiner* — Simon Nguyen
(74) *Attorney, Agent, or Firm* — Blairtech Solution LLC

(57) ABSTRACT

Systems and methods of clock generation for radio frequency receiver. In radio frequency receiver, the system requires accurate local oscillating (LO) signal and system clocks for proper operation and to ensure high quality performance. In order to achieve accurate LO frequency and system clock, a crystal or and accurate reference clock is provide to the clock generation circuit. How a low-cost receiver, it is desirable to eliminate the requirement for a crystal or an accurate reference clock. The present invention discloses systems and methods to utilize a pilot signal embedded in the transmitted signal. The pilot signal usually has very accurate frequency which is particular true for broadcast system such as FM broadcast. In various embodiments of the present invention, the systems and methods measure the relation between the frequency of the pilot signal and the current clock generated. The measured result is compared with a know relation corresponding to the frequency of the pilot signal and the target clock signal and the result is used to adjust the clock generation circuit.

20 Claims, 10 Drawing Sheets

CRYSTAL-LESS CLOCK GENERATION FOR RADIO FREQUENCY RECEIVERS

FIELD OF THE INVENTION

The present invention generally relates to radio frequency receivers and particularly to clock generation for radio receivers that do not require a crystal or a reference clock to generate an accurate reference clock.

BACKGROUND

Radio frequency receivers have been widely used in various electronic products such as AM and FM radios, television sets, and GPS (global positioning system) navigation devices. Typically there are multiple channels within the allocated spectrum. In order to receive the signal in a desired channel, the radio frequency input signal is usually mixed with a signal generated by a local oscillator (LO) to translate the incoming radio frequency signal to a lower-frequency signal suitable for further processing using cost effect components and/or for superior performance. The frequency translated signal may be a baseband signal, low-IF (intermediate frequency) or IF signal. The low frequency characteristic of the frequency translated signal makes itself ideal for digital signal processing at lower clock speed to conserve power consumption. In addition, the use of digital signal processing technique provides high flexibility for processing the underlying signal. Therefore, the radio receiver usually includes digital signal processing circuitry to perform the required receiving functions such as filtering, demodulation, and de-multiplexing (for FM stereo broadcast).

In order to receive a desired channel, the incoming radio frequency signal is mixed with a selected LO signal to translate the frequency of incoming radio frequency signal to a lower frequency signal. A bandpass or a low pass filter is applied to the mixed signal in order to filter out possible interfering signals. The proper mixer operation requires a desired LO signal to be generated responsive to the channel selection. The LO signal usually is generated by a tunable clock generation circuit which typically includes a voltage controlled oscillator coupled with phase locked loop circuitry. The LO frequency has to be substantially accurate to ensure proper system operation and good sound quality. Furthermore, system clocks for various parts of the radio receiver such as digital clock and sampling clocks for analog-to-digital converter (ADC) and digital-to-analog (DAC), also have to be substantially accurate to ensure proper system operation and high system performance. In order to meet the LO frequency and system clocks accuracy, a crystal is often used to provide the required accurate reference clock so that the LO signal and system clocks can be accurately generated using techniques such as phase-locked-loop to lock the LO frequency and the system clocks with the reference clock. Alternatively, a reference clock complying with the required frequency tolerance may also be used. The LO frequency may be locked to the external reference clock. The use of a crystal may increase the system cost. The use of an externally supplied reference clock will relieve the need for a crystal. However, an externally supplied reference clock may not be always available. For example, in a stand-alone radio receiver application, the external reference clock may not be available.

In light of the foregoing discussions, therefore it is desirable to provide systems and methods for clock generation that do not require a crystal or a reference clock. The clock generation should provide an accurate LO frequency for the receiver to tune to a desired channel and provide an accurate system clocks to the receiver for proper operation without the need of a crystal or a reference clock.

BRIEF SUMMARY OF THE INVENTION

The present invention discloses systems and methods for clock generation shared by the mixer and various parts of the system such as the digital signal processing circuitry, analog-to-digital converter (ADC) and digital-to-analog converter (DAC). A frequency-tunable voltage controlled oscillator (VCO) coupled with phase locked loop (PLL) circuitry is used to generate a local oscillator (LO) signal and system clocks. The LO signal is derived from the VCO signal and is provided to the mixer. The system clocks are derived from the VCO signal using a PLL circuit and various frequency dividers. The clock generation circuit does not include a crystal or a reference clock. In order to obtain an accurate reference clock, the clock generation circuit relies on a pilot signal transmitted in a channel. For example, the stereo FM station in the United States transmits an accurate pilot tone signal at 19 kHz. The pilot signal can be used as the reference signal by the clock generation circuit to generate accurate clocks as required.

In one embodiment, the present invention discloses a clock generation method that comprises providing a first clock signal, The clock generation method then collaborates with the radio receive to scan the plurality of channels by tuning frequency of the first clock signal until the radio receiver detects a candidate channel having a pilot signal. The pilot signal is then used to generate clocks for the radio receiver. A system for clock generation according to the above method is also disclosed.

In another embodiment, the present invention discloses a clock generation method that comprises providing a first clock signal and a second clock signal to the radio receiver, wherein a frequency synthesis method is used to generate the second clock signal from the first clock signal according to a frequency ratio. The clock generation method then collaborates with the radio receive to scan the plurality of channels by tuning frequency of the first clock signal until the radio receiver detects a candidate channel having a pilot signal. A candidate channel may be determined based on received signal strength. When the pilot signal is detected, a first control value is determined according to the frequency of the pilot signal and the frequency of the second clock signal. The method then calls for adjusting frequency of the first clock signal according to the first control value and a second control value, wherein the second control value is related to the frequency of the pilot signal and a target frequency of the second clock signal. The method further calls for adjusting the frequency ratio to compensate the change in the frequency of the second clock signal caused by the adjusting frequency of the first clock.

In yet another embodiment of the present invention, the accuracy of the generated clock can be iteratively improved by repeating the steps a) determining the first control value according to the frequency of the pilot signal and the frequency of the second clock signal, b) adjusting frequency of the first clock signal according to the first control value and a second control value, and c) adjusting the frequency ratio to compensate the change in the frequency of the second clock signal caused by the adjusting frequency of the first clock until a stop criterion is satisfied. In yet another embodiment of the present invention, the accuracy of the generated clock is further improved after the above iterative steps by using the intermediate frequency (IF) counter technique, wherein the frequency of the first clock signal is adjusted according to a value of the IF counter for a tuned channel and a computed IF counter value corresponding to the target frequency of the second clock signal.

The present invention also discloses a clock generation circuit for a radio receiver to receive radio frequency signals. The clock generation circuit comprises a first circuit to provide a first clock signal to the radio receiver and a frequency synthesis circuit coupled to receive the first clock signal to provide a second clock signal to the radio receiver. The frequency synthesis circuit generates the second clock signal from the first clock signal according to a frequency ratio. A scan control logic as part of frequency control logic is included in the clock generation circuit to provide a control signal to the first circuit and the frequency synthesis circuit, wherein the control signal causes the radio receiver to scan the plurality of channels by tuning frequency of the first clock signal until a candidate channel having a pilot signal is detected. Furthermore, the frequency control logic is coupled to receive a first control input to provide a first control output to the first circuit and a second control output to the frequency synthesis circuit, wherein the first control input is related to frequency of the pilot signal and frequency of the second clock signal, the first control output is provided to the first circuit to adjust frequency of the first clock signal according to the first control input and a target frequency of the second clock signal, and the second control output is provided to the frequency synthesis circuit to adjust the frequency ratio to compensate change in the frequency of the second clock signal due to change in the frequency of the first clock caused by the first control output. In yet another embodiment of the present invention, the frequency control logic that is coupled to further receive value of an IF counter for a tuned channel provides a further first control output based on the IF counter and a target IF count value, wherein the IF counter is clocked by the second clock signal.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIG. 1 to FIG. 9. However, those skilled in the art will readily appreciate that the detailed description given herein with respect to these figures is for explanatory purposes as the invention extends beyond these limited embodiments. In the following disclosure, though the example of FM broadcast system is often used to illustrate the operations of the present invention, it is understood that the present invention is not limited to the FM broadcast application. The present invention can be applied to any radio broadcast or communication system that includes a pilot tone in the transmitted signal.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

Figure 1:
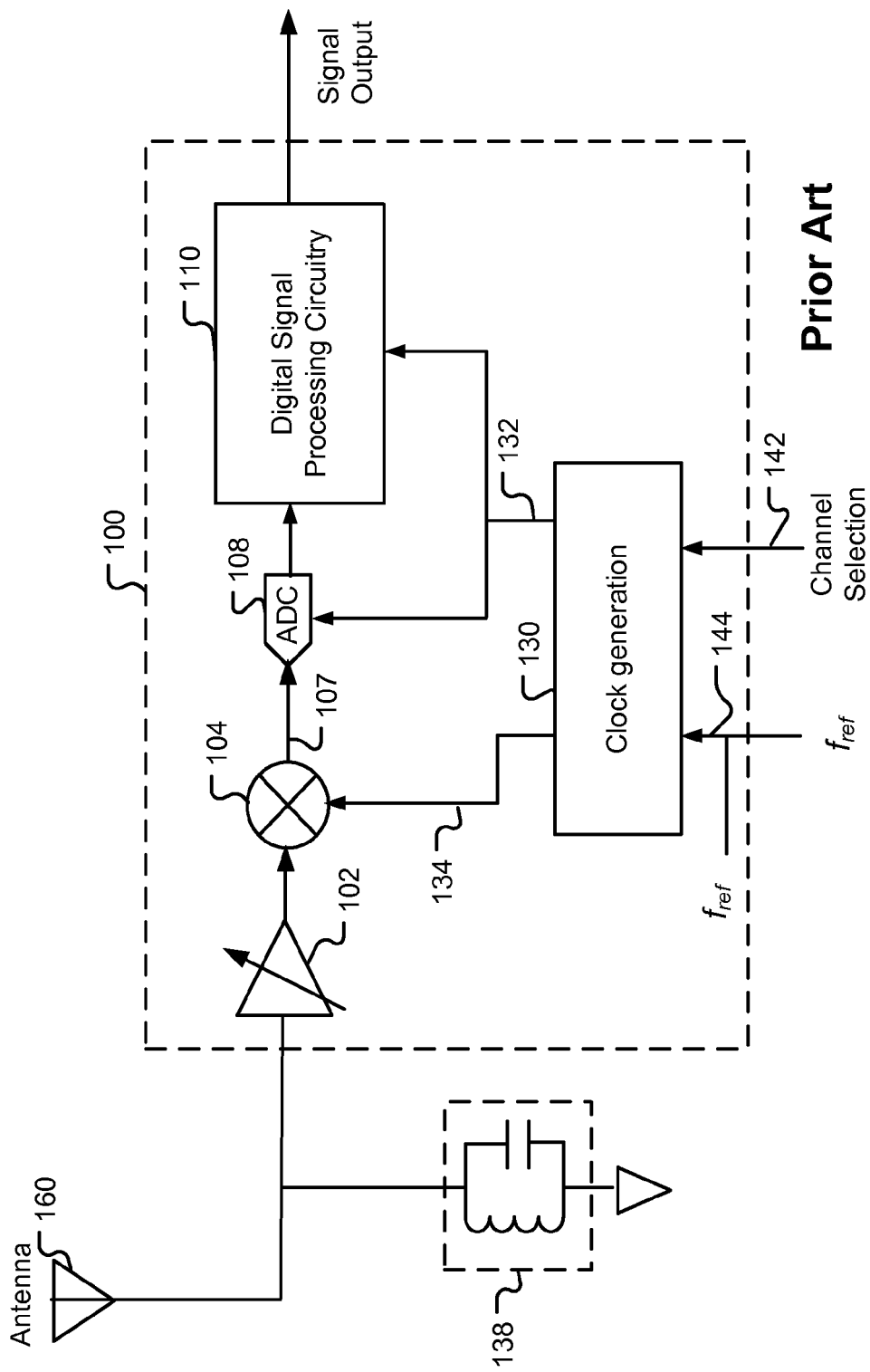
FIG. 1 shows a system block diagram of a radio frequency receiver having a prior art clock generation system.

FIG. 1 shows a conventional radio frequency receiver system that includes a clock generation circuit requiring a reference clock. The system comprises a integrated receiver unit 100 and a tunable filter 138. An external antenna 160 is coupled to the tunable filter 138 and the integrated receive unit 100 to receive radio frequency signals. The integrated receive unit 100 is coupled to the antenna 160 to receive radio frequency signals. A low noise amplifier (LNA) 102 is used to amplify the signal received from the antenna 160 which is usually a very small signal. While the LNA 102 in FIG. 1 is shown as part of the integrated receive unit 100, the LNA 102 may be an external device (off chip) in some implementation. The amplified radio frequency signal is then supplied to the mixer 104 to mix with a local oscillator signal 134. The mixer output signal 107 is the frequency translated signal corresponding to a desired signal having a frequency typically being the difference between the frequency of a desired radio frequency channel and the frequency of the LO signal. The mixed signal 107 is then converted into a digital signal by an analog-to-digital converter (ADC) 108. While a single signal line is shown in FIG. 1 for signals at various stages, the signals may be complex signals represented as an in-phase (I) component and a quadrature (Q) component. While a single mixer 104 and a single ADC 108 are shown in FIG. 1, they may be used in pairs to process the complex signal.

Upon the analog to digital conversion, the digitized signals can be conveniently processed by digital signal processing (DSP) circuitry 110. The digital signal processing circuitry 110 may be implemented in digital logics, field programmable gate array (FPGA), digital signal processor, or a combination of digital logics and microcontroller. The digital signal processing circuitry 110 will perform necessary receiving functions to receive the intended signal. For example, in an FM audio receiver, the DSP circuitry 110 will perform digital filtering, FM demodulation, de-emphasis, and stereo de-multiplexing to produce a pair of stereo audio signals.

The integrated receive unit 100 includes clock generation circuitry 130 to supply clocks required to operate various parts of the integrated receive unit 100. The clock generation circuitry 130 is responsible to generate the mixing signal 134 required by the mixer 104. The frequency of the local oscillator signal 134 is determined according to the channel selection signal 142. In the field of radio frequency receiver system, the mixing signal 134 is also called LO signal sometimes. The clock generation circuit 130 is also responsible to provide system clock 132 for digital circuits of the receiver such as various parts of the DSP module 110 and ADC 108. While a single output clock signal line 132 is shown in FIG. 1, it is understood by those skilled in the art that the clock signal 132 usually is fed to dividers with various frequency dividing factors to produce various systems clocks required by the system. These circuits also require an accurate frequency to operate properly.

In a conventional receiver, the clock generation circuit needs a stable and accurate reference clock so as to provide stable and accurate clocks for the system. The reference clock $f_{ref}$ 144 provided to the clock generation circuit usually is generated using a crystal or a reference clock. When a stable and accurate reference clock is available to the clock generation circuit, the clock generation circuit may use a technique, known as phase-locked-loop (PLL) in the field, to generate an oscillating signal having frequency related to reference clock. The oscillating frequency usually is much higher than the required LO frequency. The oscillating frequency is then divided down and compared with the reference clock and a feedback signal is generated according to the phase/frequency difference between the divided-down oscillating signal and the reference clock signal. The feedback control signal will then adjust the tuning circuit of the oscillating circuit to cause the divided-down oscillating frequency equal to the reference clock frequency.

Figure 2:
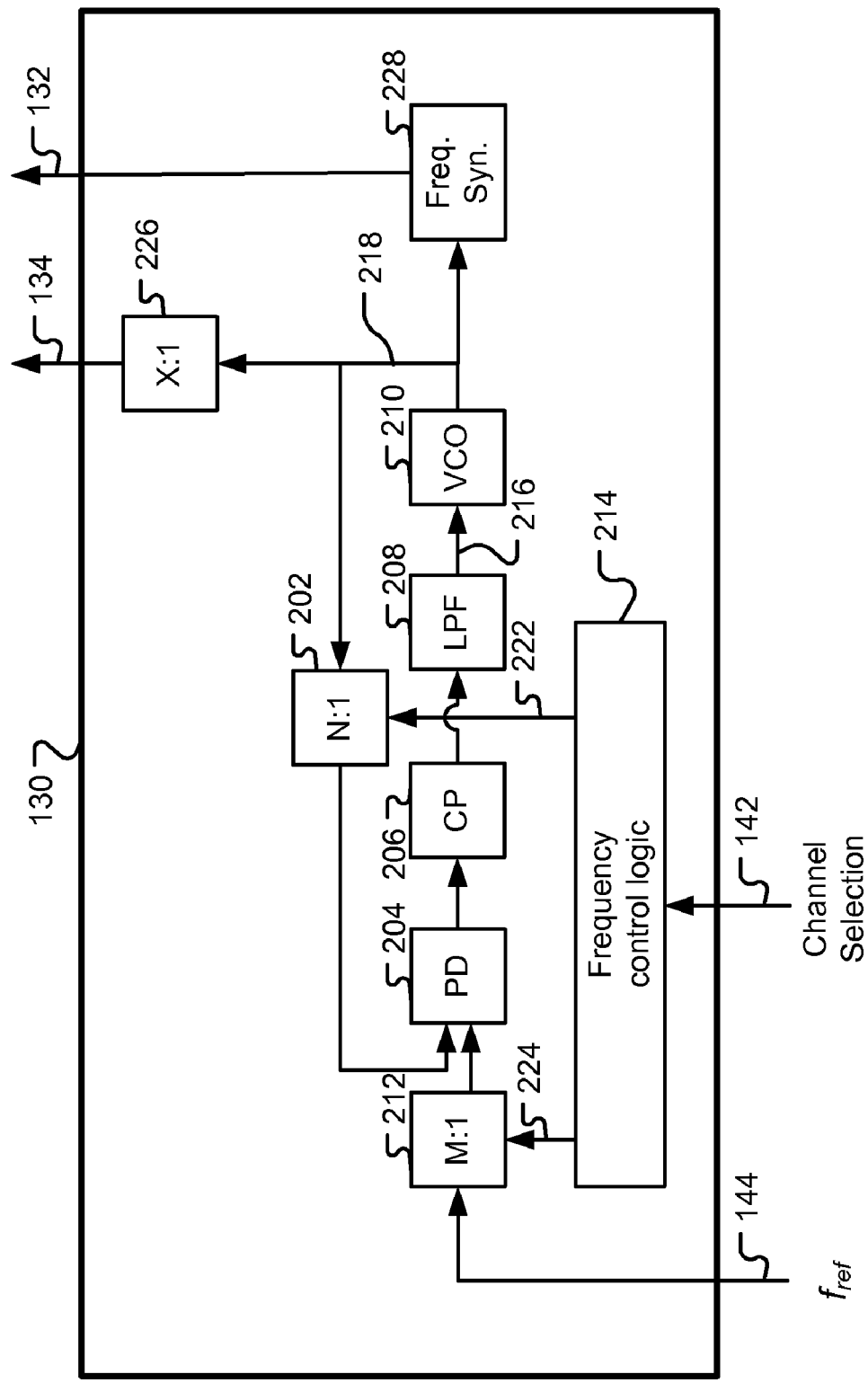
FIG. 2 shows a block diagram of a prior art clock generation system.

An exemplary prior-art clock generation circuit based on phase-locked-loop technology and a voltage controlled oscillator (VCO) is shown in FIG. 2. The VCO 210 is commonly used in this field along with PLL technology as a frequency synthesizer to generate frequencies required to receive all channels in the frequency band and frequencies required by various parts of the receiver for proper operations. The VCO usually includes tunable components such as tunable capacitors wherein the capacitance value may be changed by according to a voltage value applied to the components, or a set of selectable capacitors with pre-determined capacitance values, or a combination of both. Due to the nature of the tunable components, the resulting capacitance value is usually within a certain range, such as 10%, around a nominal value. In order to cover the spectrum of the intended channels to be received, the frequency of the oscillating signal is typically very high so that the tunable range is maintained at a small percentage of the oscillating frequency on one hand and is wide enough to cover the spectrum of received channels on the other hand. For example, the FM audio broadcast system in the US covers approximately 20 MHz spectrum from 87.9 MHz to 107.9 MHz. An oscillating frequency at 2 GHz or higher which can cover 20 MHz spectrum at 1% tunable range or less, which is much less challenging than designing a VCO with 10% tunable range.

As shown in FIG. 2, the clock generation circuit 130 relies on a reference clock 144 having a frequency $f_{ref}$. The voltage controlled oscillator 210 is used to generate a desired oscillating signal 218 wherein the frequency can be adjusted through the control signal 216. The oscillating signal generated is then frequency divided by an N:1 frequency divider 202 and the frequency divided signal is fed to a phase detector 204. The frequency divider 202 is coupled to receive control information 222 about the frequency divider factor N where N is an integer number. The phase detector (PD) 204 is coupled to receive a reference clock signal 144. However, an M:1 frequency divider 212 may be used to divide the reference clock signal before it is fed to the phase detector 204, where M is an integer. The phases of the two inputs to the phase detector 204 are compared. An output signal is generated by the phase detector and the output signal is related to the phase/frequency difference of the two inputs. The phase detector output signal is processed by the charge pump (CP) 206 to convert the output signal into a voltage signal to be used by the VCO 210. Since the control signal may fluctuate from instance to instance and cause instability of the VCO, a low-pass filter 208 should be applied to the control signal to smooth it by a low-pass filter (LPF) 208 before applying control signal 216 to the VCO 210. The channel selection 142 is processed by the frequency control logic 214 to generate control signals 222 and 224 for frequency dividers 202 and 212 respectively. The dividing factors of the frequency dividers are used to determine the desired oscillator frequency $f_{OSC}$, where $f_{OSC}=(N/M) \cdot f_{ref}$. The oscillator signal usually is divided by an X:1 frequency divider 226 to generate the desired local oscillation (LO) signal 134, where X may be an integer or a fractional number. System clocks may also be derived from the oscillation signal $f_{OSC}$ by using a frequency synthesizer 228. The frequency synthesizer 228 can be implemented using a PLL circuit.

The reference clock usually has a desired accuracy as required by the system and the reference clock may be generated using a crystal or a reference clock. The frequency can be selected as the one that the associated crystal is commonly available at low cost or the frequency is commonly available from other part of the system. For example, a crystal for real-time clock at 32.768 kHz is commonly available at low cost. Other crystals such as 12, 13 or 19.2 MHz can also be used at a slightly higher cost. For very low-cost applications, the crystal cost may still represent noticeable cost for the ASIC chip of an integrated radio frequency receiver even though the crystal cost is already low. In some applications, the system may have an accurate clock and there is no need for a crystal in these applications. Nevertheless, such accurate clock may not be always available. For example, in a stand-alone radio frequency receiver, any clock signal has to be generated internally within the clock generation system. Therefore, it is desirable to eliminate the need for a crystal or a reference clock signal to save system cost.

Figure 3:
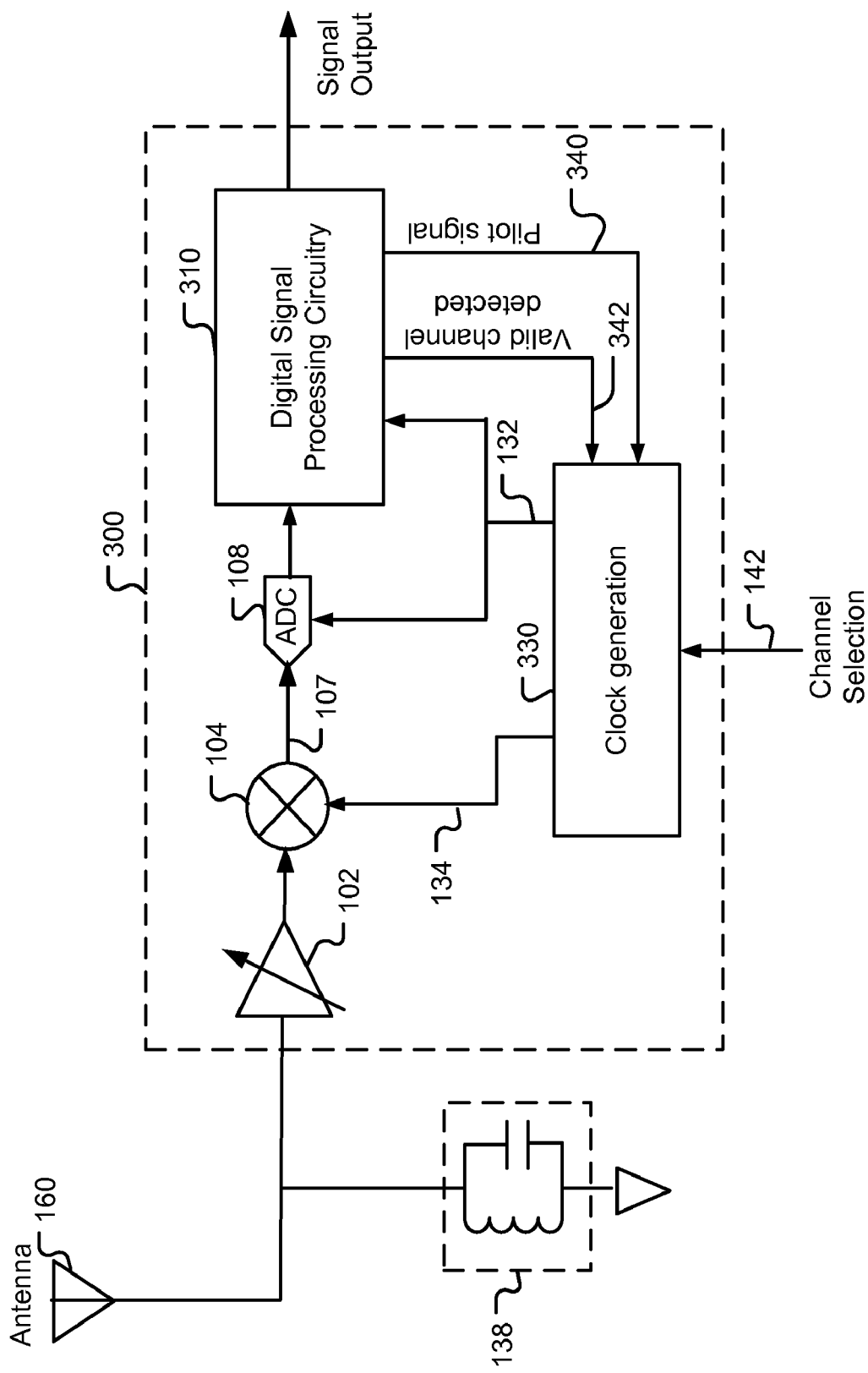
FIG. 3 shows a system block diagram of a radio frequency receiver incorporating an exemplary clock generation system according to one embodiment of the present invention.

FIG. 3 shows a radio receiver 300 having an exemplary clock generation circuit 330 incorporating an embodiment of the present invention. As shown in FIG. 3, the clock generation circuit 330 according to the present invention does not require a crystal or external clock to provide an accurate reference clock. Instead, the clock generation circuit 330 relies on the extracted pilot signal 340 which usually has sufficient accuracy as required by the receiver. In a typical modern receiver, digital signal processing techniques are often used to process down-converted signal. The digital signal processing block 310 will filter and demodulate the down-converted signal to recover the transmitted signal, which may include a pilot signal. The clock generation circuit according to the present invention also required the receiver to provide a valid channel detected signal 342 when a candidate channel is detected. The candidate channel detection may be based on the received signal strength indicator (RSSI) or other indication that indicative of the quality of the channel being received.

Figure 4A:
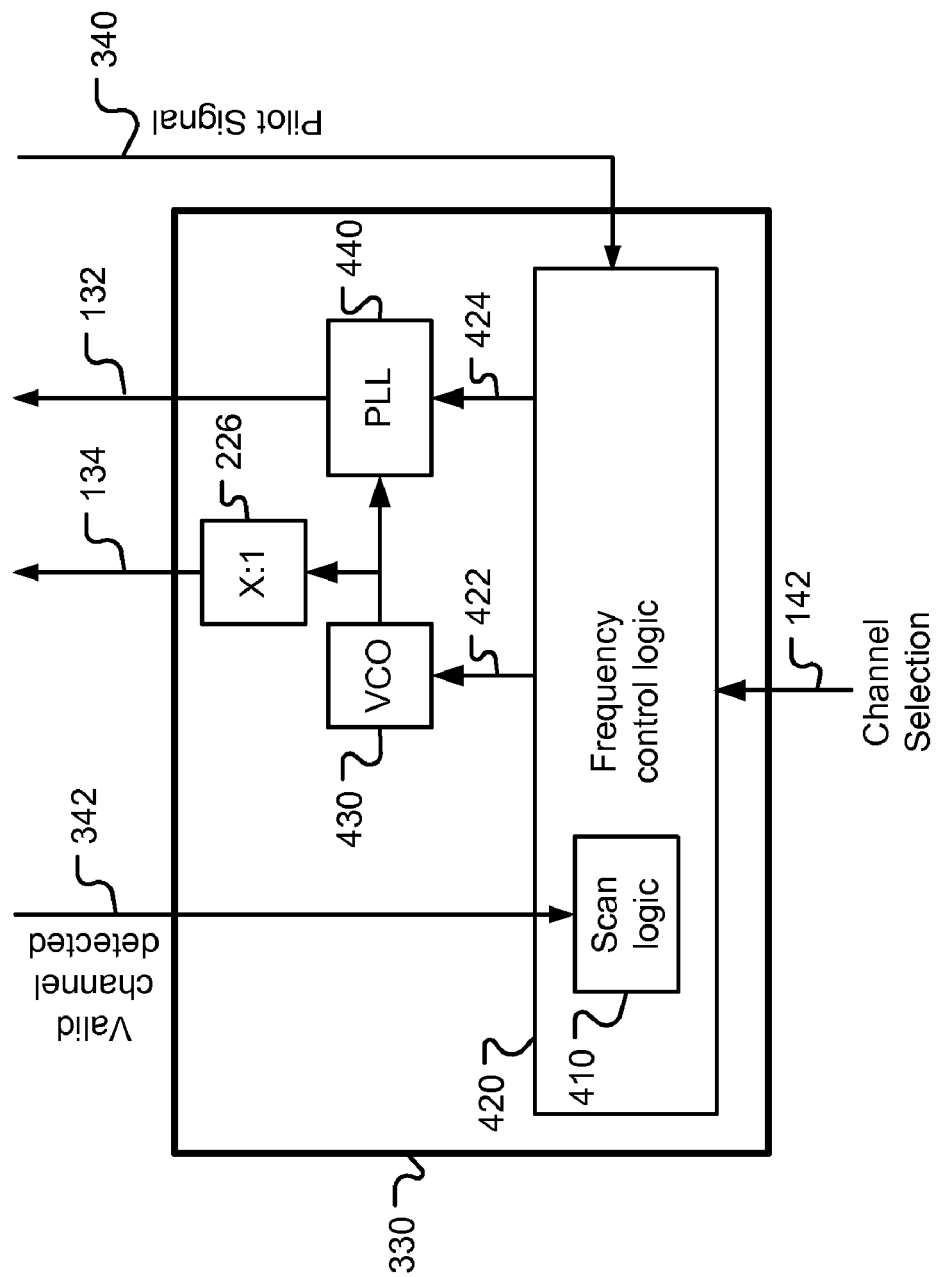
FIG. 4A shows a block diagram of an exemplary clock generation system according to one embodiment of the present invention.

FIG. 4A illustrates an exemplary implementation of the clock generation circuit 330 according to the present invention. The clock generation circuit 330 comprises a tunable oscillation circuit 430 which often is implemented using a voltage controlled oscillation (VCO) circuit. A frequency synthesis circuit 440 is used to accept the VCO signal as an input to generate a synthesized output 132. A PLL circuit is shown in FIG. 4A as the exemplary implementation of the frequency synthesizer. It is understood by those skilled in the art that other types of frequency synthesizers, such as NCO, can also be used. The VCO 430 accepts control signals 422 to tune the frequency of its output. The oscillation signal usually is processed by an X:1 frequency divider and used as local oscillation signal. The control signals 422 may be responsible for coarse and fine tuning. The ratio of the output frequency to input frequency of the PLL 440 is determined by the control signal 424. The control signals 422 and 424 for VCO 430 and PLL 440 are supplied by the frequency control logic 420. The frequency control logic 420 relies on the pilot signal 340 which is presumably accurate to derive and provide control signals to VCO 430 and PLL 440 to adjust the output frequencies as desired. The frequency control logic 420 further comprises scan logic 410 to provide a control signals coupled to the VCO 430 and the PLL 440 during the initial clock calibration.

The scan logic 410 is responsible to cause the VCO to generate frequencies required to scan all channels intended to receive by the radio receiver and also to cause the PLL to provide a desired system clock so that the DSP circuit 310 will operate properly. Since there is no accurate reference clock available to the system at this time, the frequencies generated by the VCO are subject to substantial frequency offset, which may be as larger as 10% (10 MHz offset for an intended LO frequency of 100 MHz) or more. Nevertheless, even in the worst case of frequency offset, at least some channels will be received because the spectrum of total channels is wider than the maximum frequency offset of VCO. The scan logic 410 is coupled to receive the valid channel detected signal 342 as an indication that a candidate channel has been determined. The scan logic 410 will then stay tuned at the detected channel.

Figure 4B:
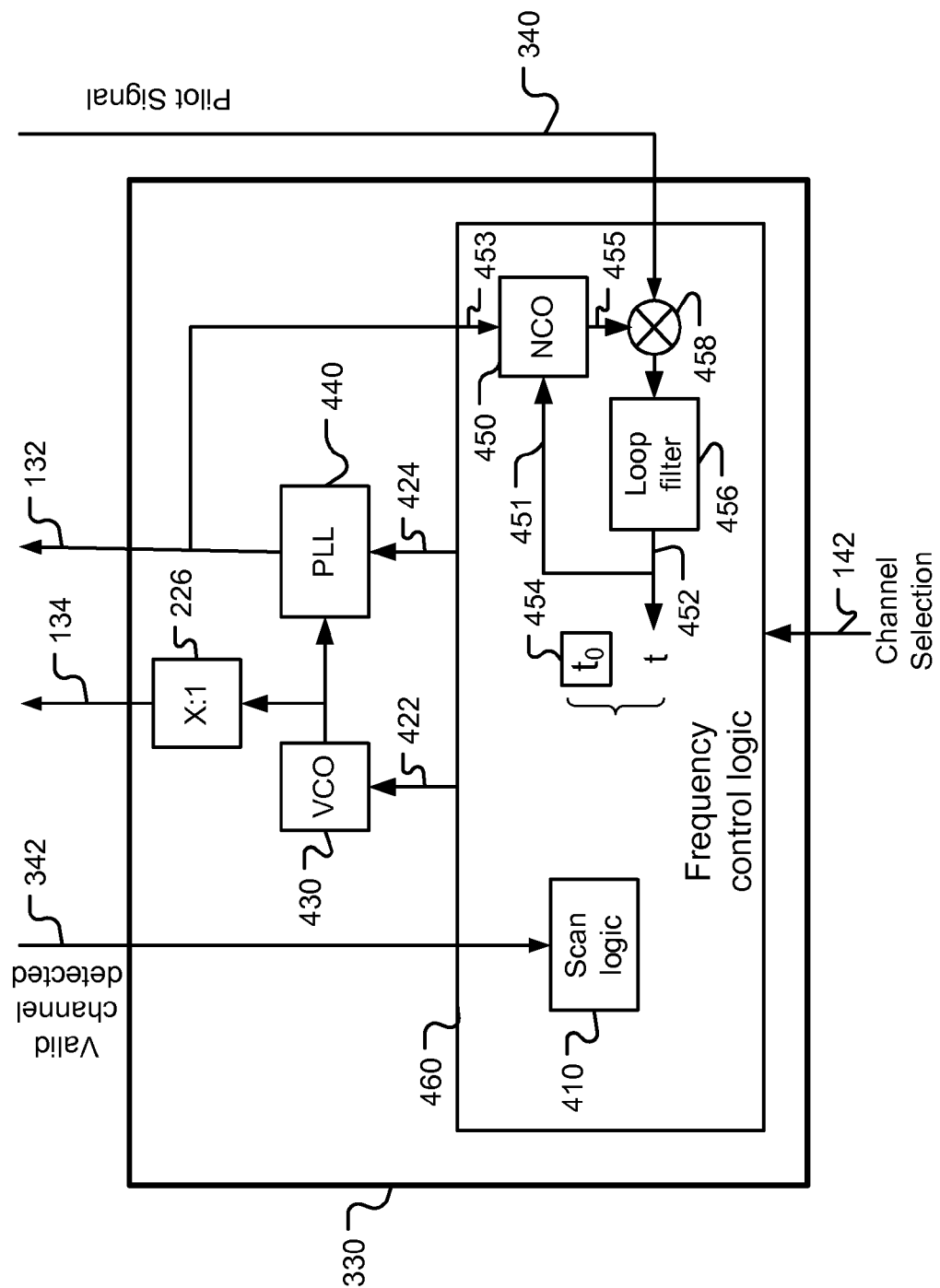
FIG. 4B shows a block diagram of an exemplary clock generation system according to one embodiment of the present invention.

FIG. 4B illustrates one exemplary implementation of the frequency control logic 460 according to one embodiment of the present invention. A numerically controlled oscillator (NCO) 450, which is also known as direct digital synthesis (DDS) circuit, is used to determine the ratio t 452 of the frequency of the pilot signal 340 to the frequency of the system clock 132. The NCO accepts an input signal 453 from the system clock signal 132 and provides an output signal 455. The frequency of the output signal 455 is related to the frequency of the input signal 453 according the tuning word 451 setting. The tuning word 451 represents the ratio of the frequency of the output signal 455 to the frequency of the system clock 132. The output signal 455 is mixed with the pilot signal 340 which has an accurate known frequency (for example, 19 kHz for FM stereo broadcast). When the frequency of the output signal 455 is the same or substantially the same as the frequency of the pilot signal, the mixer 458 will produce an output containing only direct current (DC) component. If there is any frequency offset between the output signal 455 and the pilot signal 340, there will be an alternating current (AC) component with a frequency equal to the difference of the frequency of the pilot signal 340 and the frequency of the system clock 132.

The mixer output is processed by the loop filter 456 to smooth out short term fluctuations on the ratio t. It will take some time for the NCO loop to settle down with a stable ratio t. When the ratio t is determined, the value is compared with the ratio of the frequency of the pilot signal 340 to the target frequency $f_{SYS\_0}$ of the system clock. Due to the inaccuracy of the VCO, the actual frequency of the system clock signal 132 may be different from a target frequency of the system clock. For example, the clock generation circuit 420 intends to provide a system clock at a target frequency 28.5 MHz and the actual system clock signal may be 27.075 MHz (5% lower). The ratio $t_0$ of the frequency of the pilot signal 340 to the target frequency of the system clock can be easily computed because both values are known. The ratio t measured using the NCO loop is then compared again the target ratio $t_0$. Based the values of t and $t_0$, the frequency control logic can provide control signals 422 and 424 to the VCO 430 and the PLL 440 respectively. Since the system clock signal 132 is generated from VCO through the PLL 440, the frequency of the system clock will be accurate as long as the VCO frequency is accurate. Let Y designate the fractional frequency dividing factor setting for the PLL 440, i.e., $f_{SYS}=f_{OSC}/Y$, where $f_{SYS}$ is the frequency of the system clock signal 132. When $f_{OSC}$ is fixed, ratio of $f_{SYS}/f_{SYS\_0}$ is indicated by the ratio $t/t_0$. Therefore, the frequency control logic 420 can provide a new fractional frequency dividing factor Y' as the control signal 424 that will cause the PLL 440 to adjust its output frequency toward the target frequency. Every time when a new fractional frequency dividing factor Y' is applied, a new ratio t is measured and compared with the target ratio $t_0$. An updated Y' is applied to further bring the frequency of the system clock closer to the target frequency of the system clock. The frequency control logic will determine when to stop the iteration based on a stop criterion. When the iteration stops, the frequency of the system clock is equal to or substantially close to the target frequency of the system clock. Since the system clock is locked to the VCO, the frequency control is able to determine the nominal channel frequency of the candidate channel being received. When the scan logic 410 provides the control signal coupled to the VCO 430 to scan for a candidate channel, it does not know the channel frequency of the candidate channel because the VCO inaccuracy. However, after this iterative procedure, the clock generation circuit has completed calibrating its clock frequency and is ready to receive a channel of choice. Upon the completion of the calibration stage, the frequency accuracy is expected to be in the order of 100 ppm (part per million) depending on the underlying PLL technology adopted. Nevertheless, it is desired to further improve the accuracy for better system performance.

The scan logic 410 is shown inside the frequency control logic 420 in FIG. 4. However, the block can be merged with other logic of the frequency control logic 420 or other part of the receiver path circuit. Furthermore, some parts or all parts of the clock generation circuit can be shared with the receiver path circuits, which is very attractive for a single chip radio receiver. For example, the frequency control logic 420 can be implemented using the same DSP circuit 310 used by the receiver path.

Figure 5:
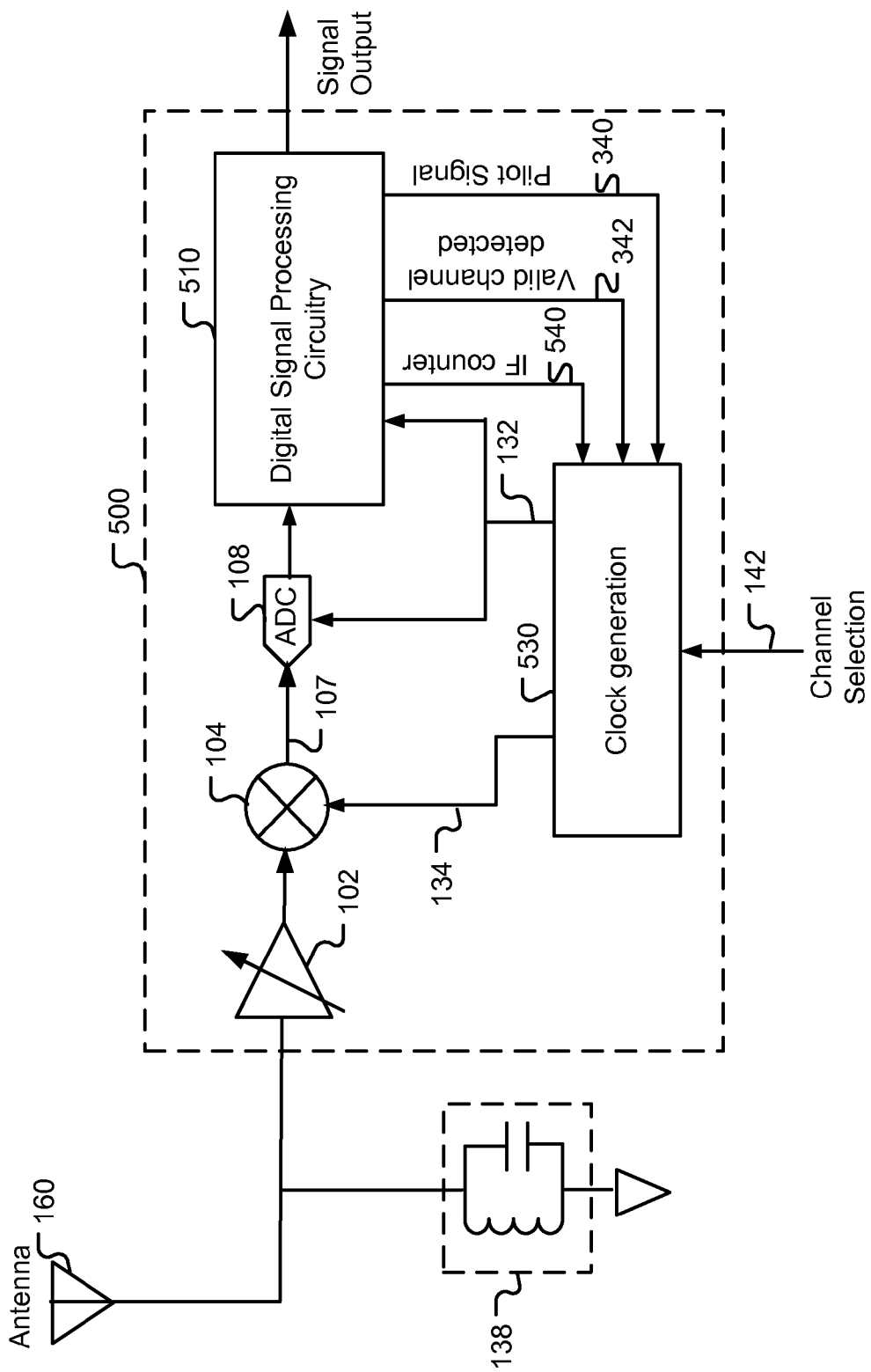
FIG. 5 shows a system block diagram of a radio frequency receiver incorporating an alternative exemplary clock generation system according to one embodiment of the present invention.

FIG. 5 shows a radio receiver 500 having an exemplary clock generation circuit 530 incorporating an embodiment of the present invention. Compared with the receiver 300 in FIG. 3, the receiver 500 includes the intermediate frequency (IF) counter 540 provided by the DSP circuit 510 to the clock generation circuit 530. The clock generation circuit 530 relies on the IF counter 540 value to further improve the frequency accuracy of generated clocks.

Figure 6:
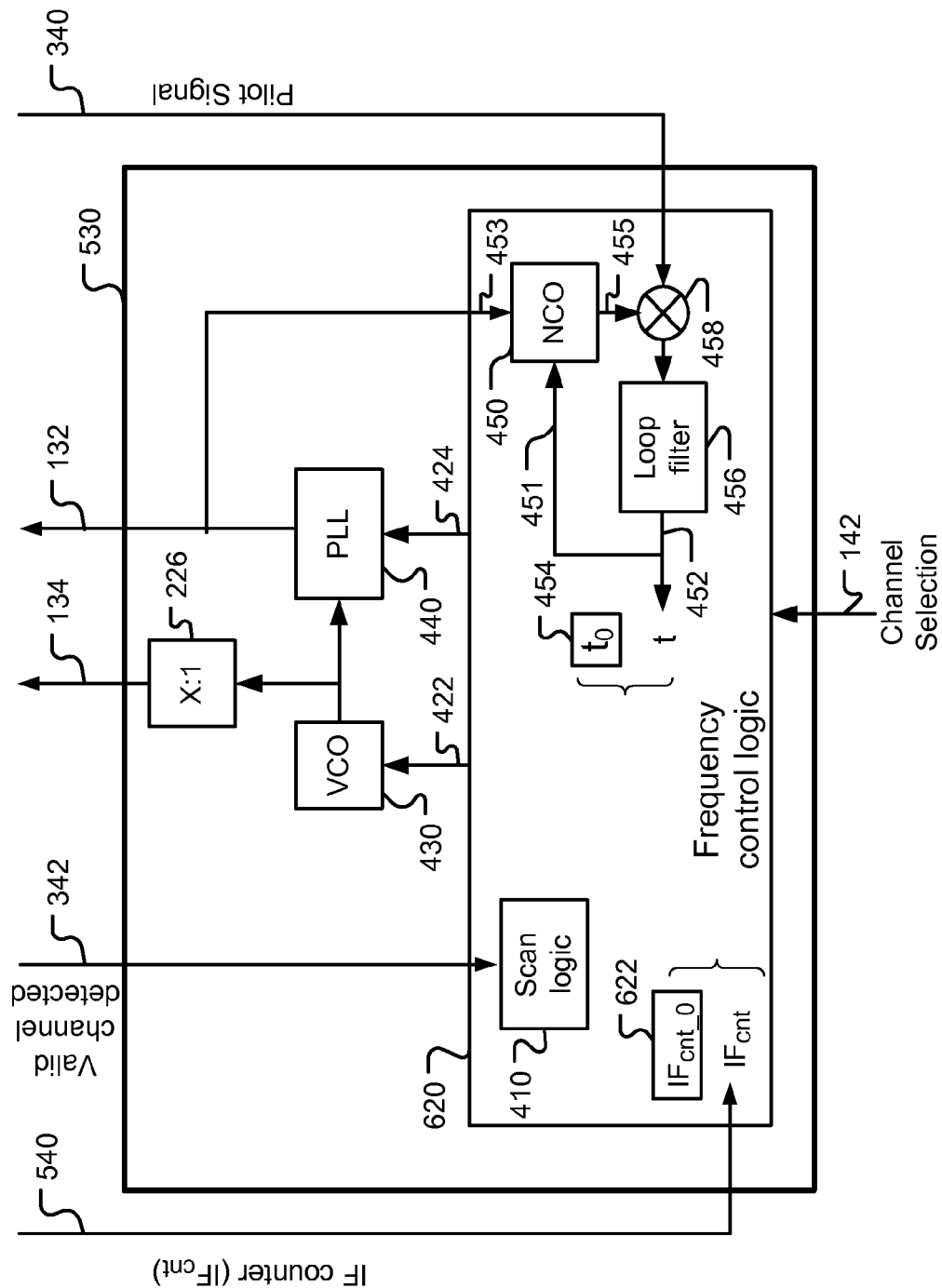
FIG. 6 shows a block diagram of an alternative exemplary clock generation system according to one embodiment of the present invention.

FIG. 6 illustrates one exemplary implementation of the frequency control logic 530 according to one embodiment of the present invention. Besides utilizing the pilot signal and the valid channel detection signal, the frequency control logic 530 also utilizes the IF counter 540 value to further improve the clock accuracy. The frequency control logic 530 will go through the initial calibration procedure as described for frequency control logic 330. Upon the completion of the initial calibration, the frequency control logic may be responsive to the channel selection signal 142 to cause the receiver to tune to a selected channel. Since the frequency has been calibrated, the receiver is able to operate according the channel selection. The carrier frequency of a broadcast signal usually has a good accuracy per regulatory requirement. The carrier frequency of the transmitted signal can be utilized to further improve the clock accuracy. Besides, if the clock generated by the clock generation circuit is tied to the frequency of the transmitted signal, the receiver may become insensitive to any slight frequency offset that may exist in the transmitted signal.

One implementation to utilize this feature is to use an intermediate frequency (IF) counter 540. The IF counter 540 value is obtained by counting the IF frequency over a period of time where the time is measured using a clock related to the system clock. The frequency of the IF signal is the difference between the frequency of the current RF input and the frequency of the LO signal. The frequency of the IF signal is pre-determined for a radio receiver. For example, 10.8 MHz has been popularly used in conventional FM broadcast radio receive. However, in modern digital implementation, the IF signal usually has much lower frequency, such as 225 kHz. The LO frequency and the system clock frequency are related because both are derived from the VCO signal. If the VCO frequency is accurate, the frequencies of LO and system clock will be known precisely. The IF counter value $IF_{cnt}$ 540 counted by the receiver can be compared with a computed IF count value $IF_{cnt\_0}$ 622 according to the carrier frequency and the time period for the counter. If the IF counter value $IF_{cnt}$ 540 is smaller than the computed IF count value $IF_{cnt\_0}$ 622, it implies that the counter time period is too short, i.e., the clock is running too fast. The frequency control logic 620 will then generate a control signal 422 to cause a decrease in the VCO frequency. Furthermore, the ratio $IF_{cnt}/IF_{cnt\_0}$ also provides an indication about the degree of frequency inaccuracy of the current VCO signal. Based on the ratio $IF_{cnt}/IF_{cnt\_0}$, the clock generation circuit may provide proper control signals 422 and 424 to cause the VCO frequency converge to a correct frequency quickly.

Figure 7:
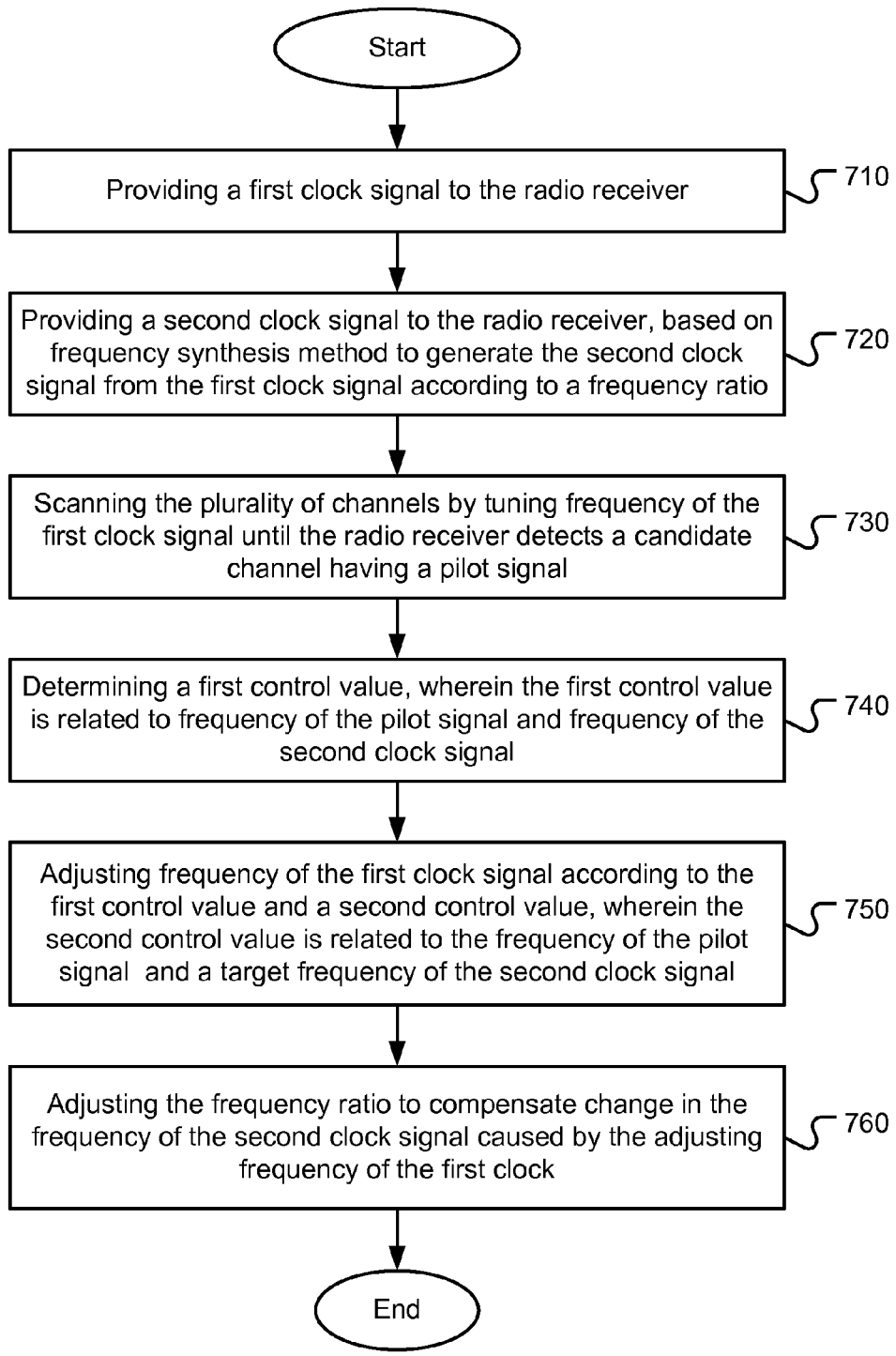
FIG. 7 shows a flowchart for a method of clock generation system according to one embodiment of the present invention.

FIG. 7 shows a flowchart of a clock generation method according to one embodiment of the present invention. The method includes providing a first clock signal and a second clock signal to the radio receiver, where the second clock is generated based on frequency synthesis method from the first clock signal according to a frequency ratio as shown in steps 710 and 720. Then the method calls for scanning the channels by tuning frequency of the first clock signal until the radio receiver detects a candidate channel having a pilot signal as shown in step 730. When a candidate channel with a pilot signal is detected, the method calls for determining a first control value as shown in step 740, wherein the first control value is related to frequency of the pilot signal and frequency of the second clock signal. The method then adjusts frequency of the first clock signal as shown in step 750 according to the first control value and a second control value, wherein the second control value is related to the frequency of the pilot signal and a target frequency of the second clock signal. Because adjusting frequency of the first clock will affect the frequency of the second clock signal, therefore the method calls for adjusting the frequency ratio to compensate change in the frequency of the second clock signal caused by the adjusting frequency of the first clock as shown in step 760.

Figure 8:
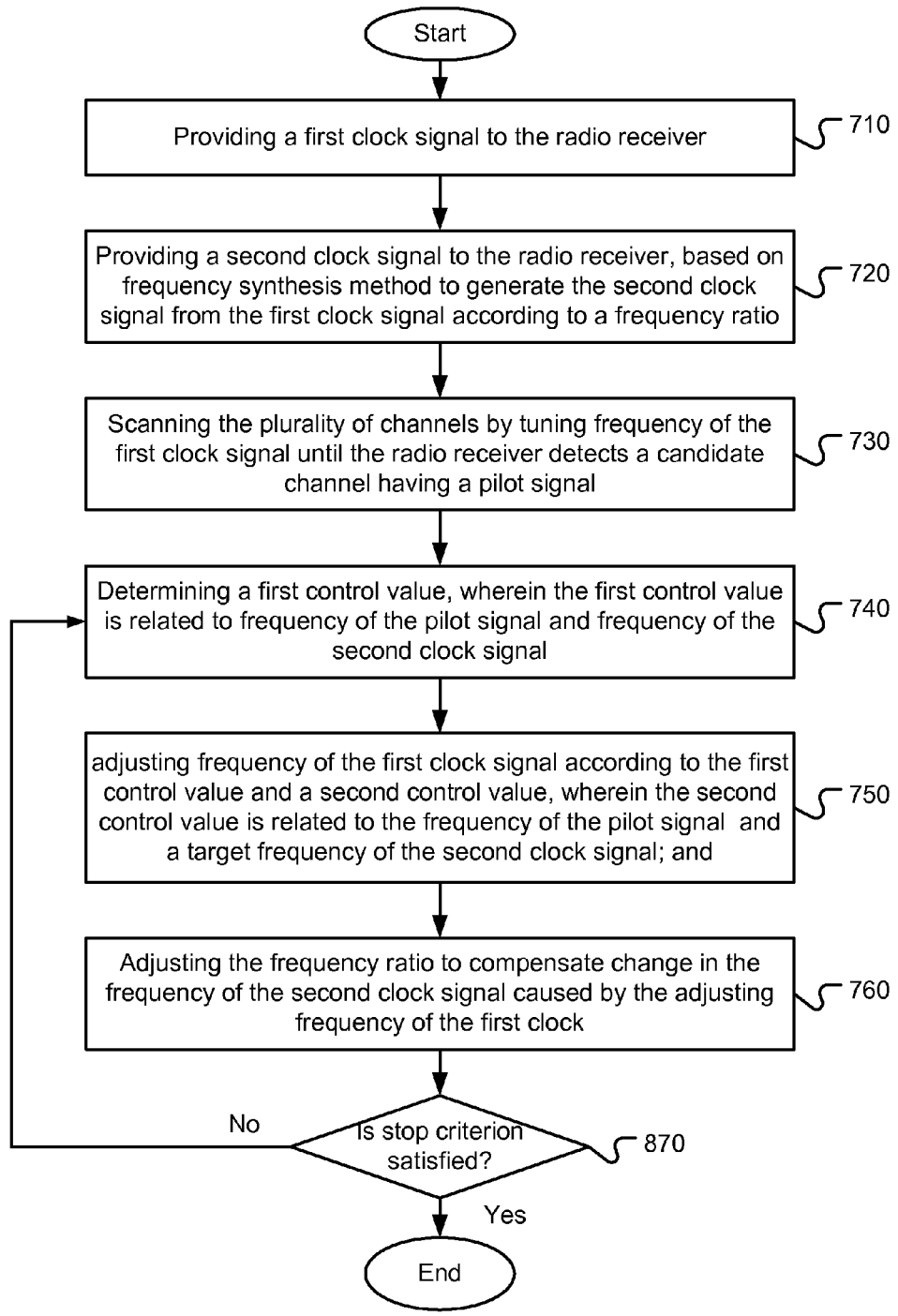
FIG. 8 shows a flowchart for an alternative method of clock generation system according to one embodiment of the present invention.

Another embodiment of the present invention includes an iterative procedure as shown in FIG. 8 to improve frequency accuracy. Most steps of the method shown in FIG. 8 are the same as the steps of the method in FIG. 7 except that a stop criterion 870 is added. If the stop criterion is met, the procedure can terminate. Otherwise, steps 740, 750 and 760 are repeated. The stop criterion may be related to frequency accuracy. For example, the frequency ratio of the pilot signal and the target second clock signal can be used to compare with the frequency ratio of the pilot signal and the actual second clock signal. The second clock signal may be used to derive system clocks. Upon exiting from the loop, the clock generation method should achieve a clock frequency with good accuracy and the system is ready to tune to a channel of selection. At the end of the flow chart shown in FIG. 8, the clock generation method is considered to finish the frequency calibration.

Figure 9:
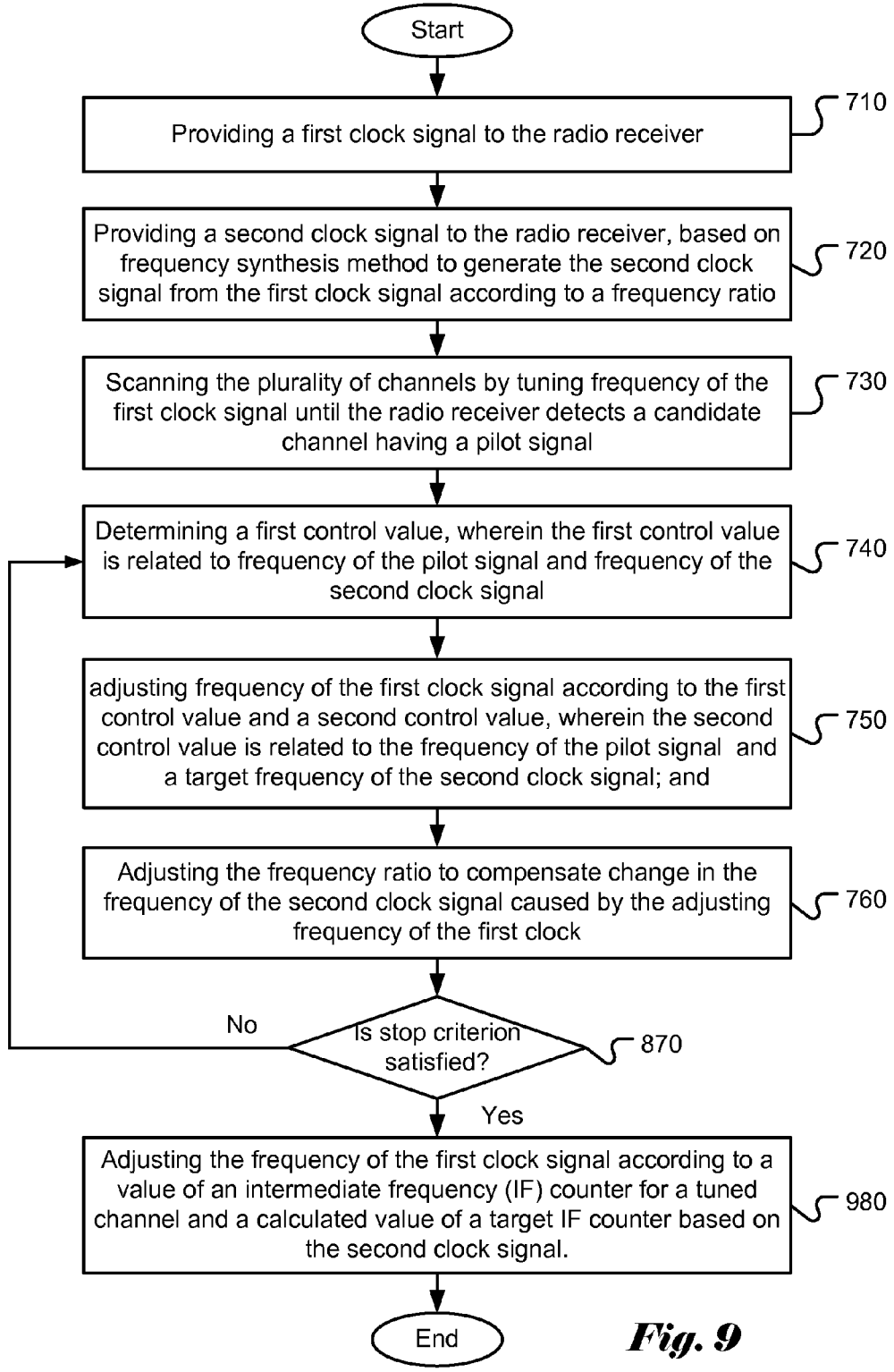
FIG. 9 shows a flowchart for another alternative method of clock generation system according to one embodiment of the present invention.

FIG. 9 illustrates a clock generation method including calibration and tracking during normal RF channel receiving. The method is substantial the same as the method shown in FIG. 8 except for the step 980 corresponding to tracking the frequency for a select channel. When the clock generation is calibrated, the receiver is ready to tune to a channel of selection. To track the carry frequency of the RF input signal, the method calls for adjusting the frequency of the first clock signal according to a value of an intermediate frequency (IF) counter for a tuned channel and a counted target IF value based on the second clock signal.

The invention may also involve a number of functions to be performed by a computer processor, a digital signal processor, a microprocessor, or field programmable gate array (FPGA). These processors can be configured to perform particular tasks according to the invention, by executing machine-readable software code or firmware code that defines the particular methods embodied by the invention. The software code or firmware codes may be developed in different programming languages and different format or style. The software code may also be compiled for different target platform. However, different code formats, styles and languages of software codes and other means of configuring code to perform the tasks in accordance with the invention will not depart from the spirit and scope of the invention.

The invention may be embodied in other specific forms without departing from its spirit or essential characteristics. The described examples are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A clock generation method for a radio receiver to receive radio frequency signal having a plurality of channels, the method comprising:

providing a first clock signal to the radio receiver;

scanning the plurality of channels by tuning frequency of the first clock signal until the radio receiver detects a candidate channel having a pilot signal;

generating system clocks based on the pilot signal;

determining a first control value, wherein the first control value is related to frequency of the pilot signal and frequency of the first clock signal; and adjusting frequency of the first clock signal according to the first control value and a second control value, wherein the second control value is related to the frequency of the pilot signal and a target frequency of the first clock signal.

2. The clock generation method of claim 1, further comprising steps of:

providing a second clock signal to the radio receiver, wherein a frequency synthesis method is used to generate the second clock signal from the first clock signal according to a frequency ratio; and adjusting the frequency ratio to compensate change in the frequency of the second clock signal caused by the adjusting frequency of the first clock.

3. The clock generation method of claim 1, wherein the first clock signal is generated by a tunable oscillation circuit.

4. The clock generation method of claim 3, wherein the tunable oscillation circuit is a voltage controlled oscillator (VCO).

5. The clock generation method of claim 1, wherein the frequency synthesis method is a phase locked loop (PLL) method.

6. The clock generation method of claim 5, wherein the frequency synthesis method is capable of synthesizing a fractional frequency.

7. The clock generation method of claim 1, wherein the candidate channel is determined according to a channel having strongest signal strength.

8. The clock generation method of claim 1, wherein the first clock signal is associated with a local oscillating (LO) frequency for a mixer of the radio.

9. The clock generation method of claim 1, wherein the second clock signal is associated with a system clock of the radio receiver.

10. The clock generation method of claim 1, wherein the first control value is a ratio of the frequency of the pilot signal to the frequency of the second clock signal.

11. The clock generation method of claim 10, further comprising using a numerically controlled oscillator (NCO) to determine the ratio of the frequency of the pilot signal to the frequency of the second clock signal.

12. The clock generation method of claim 1, further comprising repeating steps of the determining a first control value, the adjusting frequency of the first clock signal, and the adjusting the frequency ratio until a stop criterion is satisfied.

13. The clock generation method of claim 12, wherein the stop criterion is related to clock accuracy of the second clock signal.

14. The clock generation method of claim 12, further comprising an additional step of adjusting the frequency of the first clock signal according to a value of an intermediate frequency (IF) counter for a tuned channel and a calculated value of a target IF counter based on the second clock signal.

15. A clock generation circuit for a radio receiver to receive radio frequency signal having a plurality of channels comprising:

a first circuit to provide a first clock signal to the radio receiver;

a scan control logic to scan the plurality of channels by tuning frequency of the first clock signal until the radio receiver detects a candidate channel having a pilot signal;

a second circuit to generate system clocks based on the pilot signal;

a frequency control logic, wherein the frequency control logic determines a first control value related to frequency of the pilot signal and frequency of the first clock signal wherein the frequency control logic adjusts frequency of the first clock signal according to the first control value and a second control value, wherein the second control value is related to the frequency of the pilot signal and a target frequency of the first clock signal.

16. The clock generation circuit of claim 15, further comprising:

a third circuit to provide a second clock signal to the radio receiver, wherein a frequency synthesis circuit is used to generate the second clock signal from the first clock signal according to a frequency ratio and wherein the frequency control logic is used to adjust the frequency ratio to compensate change in the frequency of the second clock signal caused by the adjusting frequency of the first clock.

17. The clock generation circuit of claim 16, wherein the frequency synthesis circuit is a phase locked loop (PLL) circuit.

18. The clock generation circuit of claim 16, wherein the second clock signal is associated with a system clock of the radio receiver.

19. The clock generation circuit of claim 15, wherein the first control value is a ratio of the frequency of the pilot signal to the frequency of the second clock signal.

20. The clock generation circuit of claim 19, further comprising a numerically controlled oscillator (NCO) to determine the ratio of the frequency of the pilot signal to the frequency of the second clock signal.

* * * * *